United States Patent [19]

Pathak et al.

[11] Patent Number: 5,383,193
[45] Date of Patent: Jan. 17, 1995

[54] METHOD FOR TESTING NON-VOLATILE MEMORIES

[75] Inventors: Saroj Pathak, Los Altos Hills; Glen A. Rosendale, Santa Clara; James E. Payne, Boulder Creek, all of Calif.

[73] Assignee: Atmel Corporation, San Jose, Calif.

[21] Appl. No.: 951,207

[22] Filed: Sep. 25, 1992

[51] Int. Cl.[6] ............................................. G11C 29/00
[52] U.S. Cl. .................................... 371/21.4; 365/201
[58] Field of Search ................. 371/21.4, 21.1, 25.1, 371/10.2, 10.3, 62, 61; 365/201; 395/575, 550

[56] References Cited

U.S. PATENT DOCUMENTS

| | | | |
|---|---|---|---|
| 4,573,146 | 2/1986 | Graham et al. | 365/200 |
| 4,639,897 | 1/1987 | Wacyk | 365/200 |
| 4,920,515 | 4/1990 | Obata | 365/189.08 |
| 5,031,152 | 7/1991 | Doyle | 365/201 |

Primary Examiner—Robert W. Beausoliel, Jr.
Assistant Examiner—Phung Chung
Attorney, Agent, or Firm—Schneck & McHugh

[57] ABSTRACT

A method is provided for testing a non-programmable non-volatile memory which does not require the writing or erasing of any cells and permits the testing of all normal memory cells. Testing occurs from the device I/O pins and is useful in cases where EPROM memory cells have been bulk erased and placed within an ultraviolet-opaque package. The non-volatile memory is of the type having memory banks of rows and columns. Each bank must have address decoders and means for changing addresses between banks. A separate auxiliary cell or row of cells in a state different from the non-programmed state is provided. An address is supplied for the auxiliary cells and then for the normal cells and the interval between addressing the normal cells and the appearance of an output signal is measured and compared with a predetermined fixed limit. If the limit is exceeded, the address is identified as that of a weak cell whose speed does not meet product specifications. In suitably equipped memories, the addresses of weak cells can be recorded and redundant cell groups substituted as replacements.

13 Claims, 2 Drawing Sheets

METHOD FOR TESTING NON-VOLATILE MEMORIES

DESCRIPTION

1. Technical Field

The present invention relates to methods for testing memory cells particularly in non-volatile memories such as EPROM's.

2. Background Art

Under certain manufacturing procedures it is often necessary to test an EPROM after it has been bulk erased and sealed in a UV-opaque package for shipment from the factory. The unprogrammed EPROM is difficult to test since programming is to be avoided.

A variety of test approaches have been proposed, most requiring additional memory cells or cell groups which are not part of the regular memory array and which can be programmed for limited testing of circuits shared with normal memory cells, i.e. a statistical sampling method. U.S. Pat. Nos. 4,920,515 and 4,862,418 are recent examples of this approach. Another partial solution has been the addition of circuits used to measure thresholds of normal memory cells without causing permanent change of state. This approach is exemplified by the teachings of U.S. Pat. Nos. 4,956,816, 4,779,272 and 4,393,475. Though leakage current and stray capacitance can be monitored by such techniques, additional circuits are needed and the assurance of a completely tested memory cell is lacking.

Doyle, in U.S. Pat. No 5,031,152 places a programmable latch at the output of a non-volatile memory cell, programs the latch, and allows the erased memory cell to reset the latch thereby demonstrating an ability to perform that part of the memory cell's task. But even the Doyle test circuit requires the addition of at least one circuit per sense amplifier.

One particular problem arises when it is desired to test the read access time for each EPROM in the array, to achieve higher reliability than in the statistical approach. After a first EPROM transistor in a LOW state is accessed, the read access time is the time delay in which the memory output follows the access request. When all of the transistors are LOW, there is ambiguity in determining this time delay.

What is needed is a method for testing the operability and read access delay time of normal memory cells without the addition of a large number of throwaway memory cells or special testing circuits.

It is an object of the present invention to provide a method for testing the normal memory cells of a non-volatile memory without writing or erasing any cell, without adding a large number of throwaway cells or cell groups, and by adding a minimum of additional circuitry.

It is a further object of this invention to provide a method for testing all normal cells and cell groups for both operability and for speed.

SUMMARY OF THE INVENTION

The above objects have been met by a method which provides a non-volatile memory having rows and columns of memory cells in a first memory state, an auxiliary transistor cell or row or bank or dummy cell in a second memory state, distinguishable from the first state, and at least one sense amplifier providing a memory output. Each memory cell in the first state is associated with a time delay between the cell's being addressed while in the first state and the cell's producing a memory output. The memory output of an addressed cell in the first state is a first logic level. The memory output when addressing the auxiliary cell, row, bank or dummy cell is a second logic level. Memory cells are tested by first addressing the alternate cell so that memory output is at the second logic level. Then a cell or row or column in the main array is addressed and the delay from enabling to appearance of the first logic level at the memory output is measured. The measurement is compared with a limit representing a maximum acceptable delay. If the limit is exceeded, the address is recorded and identified as a weak cell. In this manner it is possible to test one hundred percent of the normal memory cells in an efficient manner.

BEST MODE FOR CARRYING OUT THE INVENTION

Figure 1:
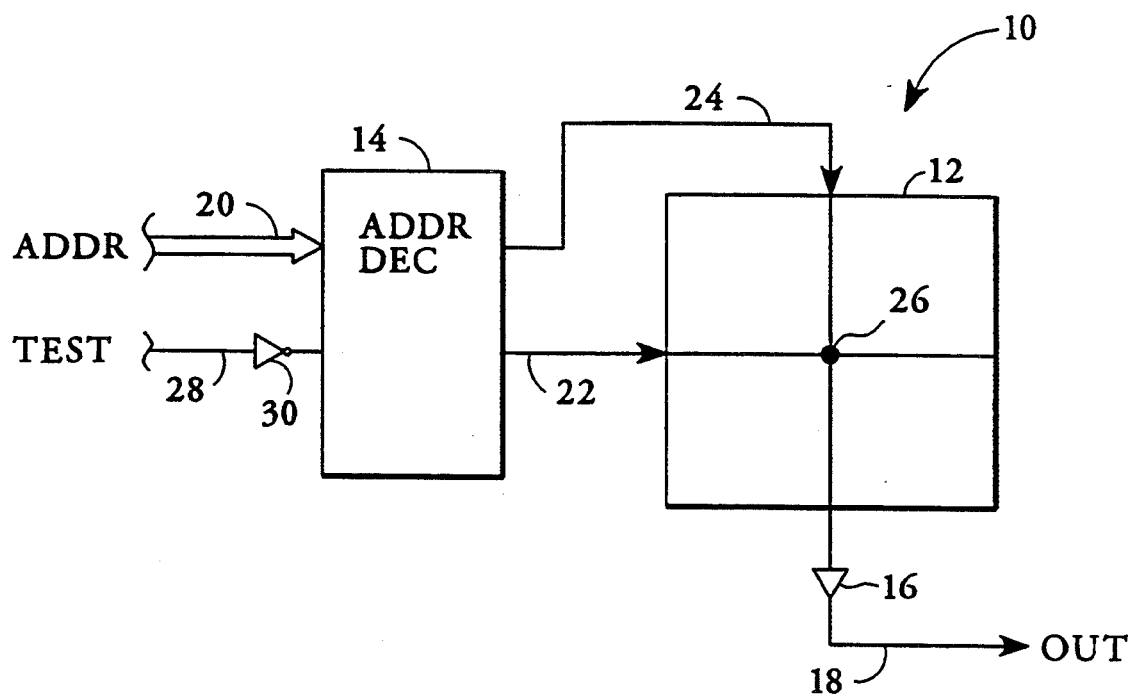
FIG. 1 is a block diagram showing an apparatus for the practiced the present invention.

With reference to FIG. 1 there is shown non-volatile memory 10, upon which may be practiced the present invention. Memory 10 has a memory bank 12 having rows and columns of addressable memory cells, of which cell 26 is an example. Memory 10 has at least one sense amplifier 16 producing a signal OUT on memory output line 18. Memory 10 receives ADDRESS signals on lines 20. These are connected as inputs to an address decoder 14 for producing a plurality of row select signals, an example of which is shown on line 22, and a plurality of column select signals, as for example the signal on line 24. These individual select signals are used to address predetermined rows and columns of normal memory cells. Address decoder 14 receives an enable input from inverter 30 in response to a TEST signal on input line 28. A selected cell, such as cell 26, produces an output which is amplified by sense amplifier 16, producing the output signal OUT on memory output line 18.

When address decoder 14 addresses an alternate cell, such as a dummy cell, not shown, an output signal OUT will be at a second logic level. When an address is applied to address decoder 14 and the input signal TEST is negated, the address decoder is enabled and select signals such as those on line 22 and 24 are generated selecting a cell to be tested, such as cell 26 of FIG. 1. All the normal memory cells, such as cell 26, are in a first state. When memory cells in a first state are selected, after an interval of time output signal OUT will be at a first logic level. The length of this interval is inversely proportional to a time delay of the selected cell. If the resulting interval is less than or equal to a predetermined fixed limit, the cell is said to have passed its test. If, on the other hand, the resulting interval is greater than the fixed limit, the cell has failed its test and the address which resulted in the cell's selection is identified as a weak cell—the address itself is referred to as the weak cell even though it is technically the address of a weak cell. In memories which are equipped with means for doing so, the address of a weak cell is recorded and a redundant row or column substituted in its place.

Figure 2:
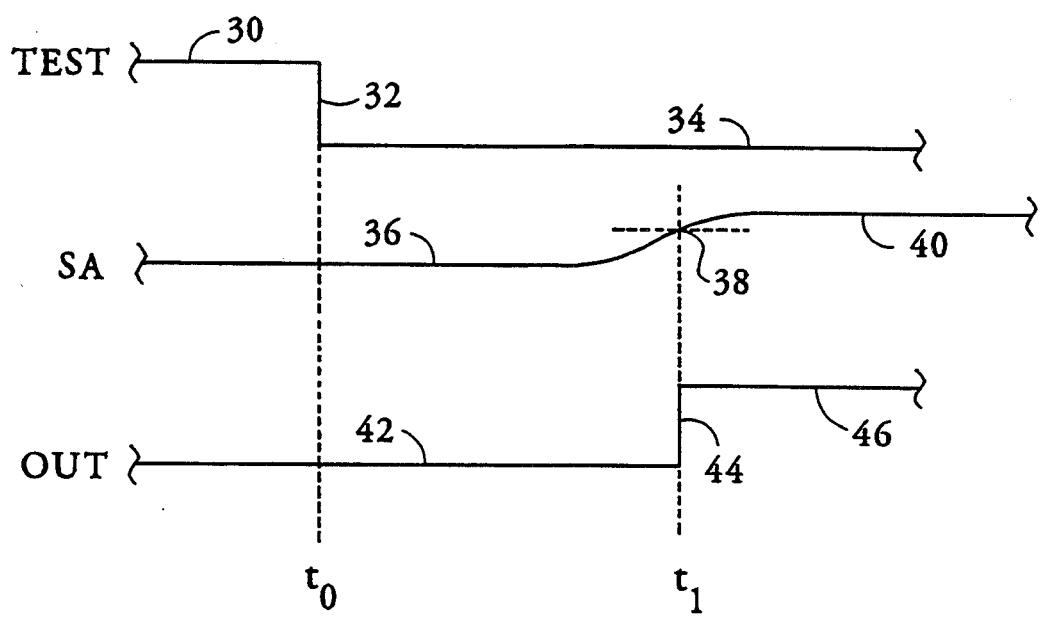
FIG. 2 is a waveform diagram showing a portion of the operation of the apparatus of FIG. 1.

FIG. 2 shows several signal waveforms associated with the practice of the method of the present invention upon the apparatus of FIG. 1. The vertical axis of the diagram is used to represent a logic level for each of the three waveforms. The horizontal axis is used to represent time which increases from left to right. The top waveform represents the input signal TEST of FIG. 1. Initially shown at a HIGH logic level 30, it switches at time $t_0$, depicted by falling waveform 32, to a LOW logic level 34 at which level it remains. The middle waveform represents an input to sense amplifier 16 of FIG. 1. The signal SA begins at a LOW logic level 36 and, after an interval of time, begins to rise passing through a switching threshold 38 at time $t_1$, continuing to rise to a HIGH logic level 40 at which it remains. The bottom waveform represents output signal OUT of FIG. 1. It is shown at the left side of FIG. 2 at a false logic level 42. At time $t_1$ it changes level at transition 44 and thereafter remains at a true logic level 46.

The waveforms depicted in FIG. 2 are related to one another by the behavior of elements of memory 10 during an interval beginning just before input signal TEST goes LOW at $t_0$, initiating a memory cell selection cycle, and continuing beyond the end of the cycle at time $t_1$. When TEST changes from true to false at $t_0$, address decoder 14 of FIG. 1 begins a process of decoding an address, ultimately producing, in the example of FIG. 1, select signals on lines 22 and 24. The simultaneous appearance of select signals on these two lines results in the selection of cell 26 of FIG. 1. At a point in time intermediate between time $t_0$ and time $t_1$, a signal SA at the input to sense amplifier 16 of FIG. 1 begins to rise from a LOW level 36 toward a HIGH level 40. At a level 38 of signal SA which corresponds to a switching threshold of sense amplifier 16, the output of the sense amplifier, OUT, will switch from a previously LOW level 42 to a HIGH level 46 thereby producing an output on line 18 of FIG. 1.

If the interval of time between $t_0$ and $t_1$ is less than or equal to the predetermined fixed limit, cell 26 will have passed its test. If on the other hand the above described interval of time exceeds the fixed limit, the address which resulted in the selection of cell 26 will be identified as a weak cell. By repeating this process with each of the cells or cell groups of memory bank 12 of FIG. 1, all the cells can be tested without a need to write into any normal or dummy cell or to erase any cell.

An exemplary testing method includes the following steps: (1) providing an apparatus suitable for the practice of the method such as that depicted in FIG. 1 and described above; (2) disabling addressing—in the example of FIG. 1 by asserting the TEST signal; (3) applying an address to the address decoder—in the present example by applying the address to the ADDRESS lines 20 of the apparatus of FIG. 1; (4) enabling address decoding—in the present example by negating the TEST signal; (5) measuring the length of the interval from the enabling of address decoding to the time of the appearance of an output—in the present example, measuring from time $t_0$ to the appearance of a true logic level at signal OUT at time $t_1$; (6) comparing the resulting measurement with the predetermined fixed limit and if the measurement is less than or equal to the limit, concluding that the cell has passed the test, but if the measurement exceeds the limit, declaring the address of the cell as a weak cell.

The validity of a test of this type arises from the fact that the ability of an addressed cell, previously in a first state, to produce the signal SA of FIG. 2 at the input to sense amplifier 16 of FIG. 1, resulting in an output OUT on line 18 of FIG. 1 within the predetermined fixed limit provides an acceptable assurance that the cell can be read at a speed guaranteed by the device specifications. Further, the testing method allows the testing of all the memory cells or cell groups without the addition of apparatus beyond that needed to disable and enable address decoding.

Figure 3:
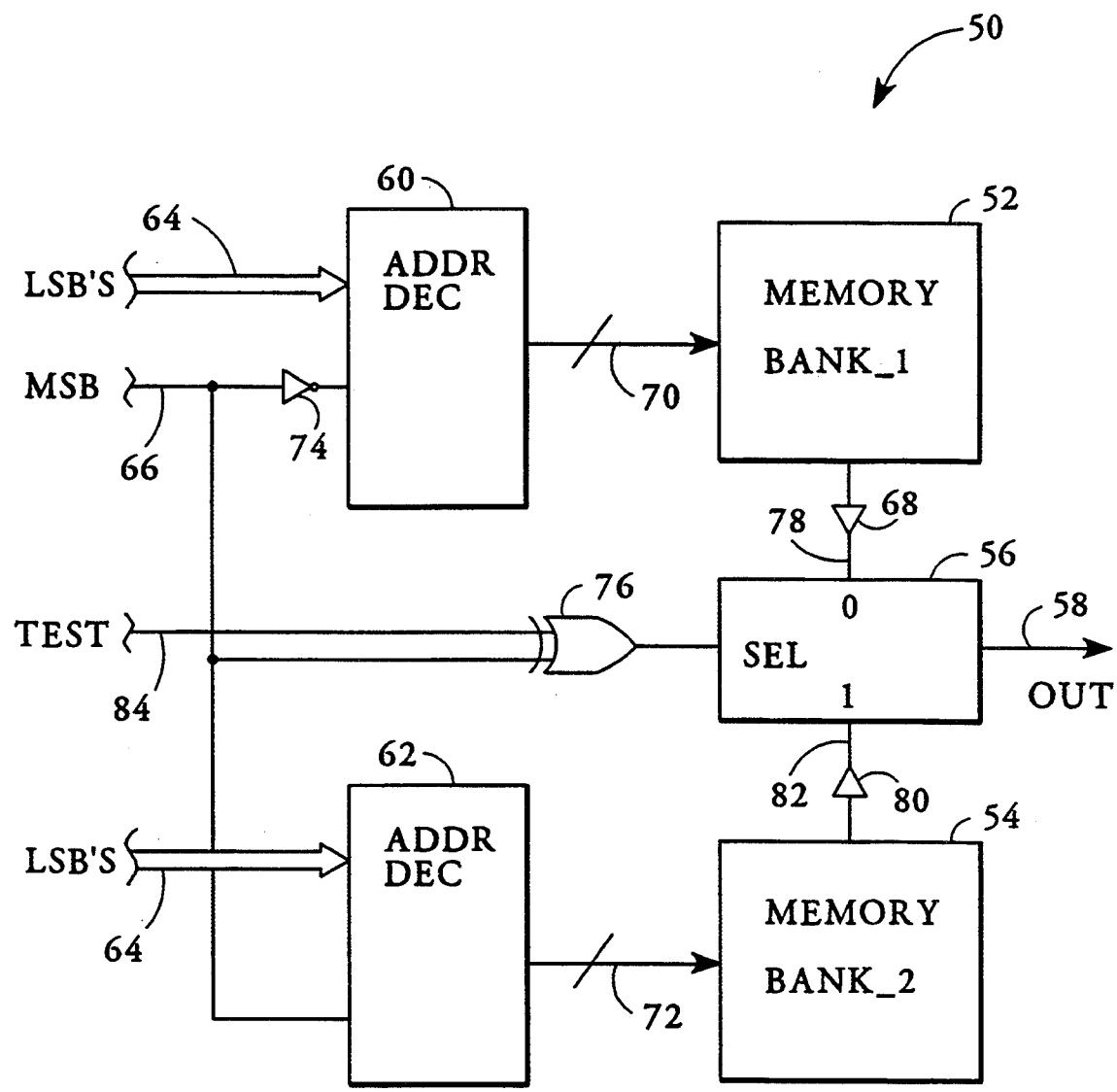
FIG. 3 is a block diagram of a second embodiment of the invention of FIG. 1.

FIG. 3 is a block diagram of a second apparatus upon which the present invention may be practiced. Nonvolatile memory 50 includes at least two memory banks 52 and 54. Each memory bank has its own address decoder 60 and 62, and at least one sense amplifier 68 and 80. The outputs of each sense amplifier are connected to separate data inputs of a selector 56 whose output is controlled by a select signal generated by, for example exclusive-OR gate 76. The selector output provides memory output signal OUT on line 58. The address decoders 60 and 62 for each memory bank receive all the address signals except the most significant address signal on input lines 64. These signals are referred to as the LSB's to indicate that they do not include the most significant bit of the address. The address signal corresponding to the most significant address bit is referred to as the MSB and is received on input line 66. Signal MSB is applied directly to the enable input of address decoder 62 for the second memory bank 54. Signal MSB is inverted by inverter 74 and the resulting signal is applied to the enable input of address decoder 60 for the first memory bank 52. With such a connection, the first memory bank 52 will respond to addresses for which the MSB is a 0 while the second memory bank 54 will respond to addresses for which the MSB is a 1. Thus for example, if each memory bank is capable of responding to 1024 different addresses, the first memory bank 52 will respond to addresses 0 through 1023 while the second memory bank 54 will respond to addresses 1024 through 2047. The exclusive-OR gate 76, used to select the sense amplifier whose output will provide output signal OUT on line 58, receives inputs from MSB and an input signal TEST received on input line 84. In normal memory operation, TEST remains at a LOW logic level or line 84 simply remains unconnected. Under these conditions, the output of gate 76 is equal to the logic level of MSB. When the logic level of MSB is LOW, the output 78 of sense amplifier 68 is selected to provide output signal OUT. This selection corresponds to the fact that when the logic level of MSB is LOW, address decoder 60 is enabled producing row and column select signal 70 to the first memory bank 52. Address decoder 62 is disabled. Alternatively, when the logic level of MSB is HIGH, address decoder 60 is disabled and address decoder 62 is enabled generating row and column select signals 72 to the second memory bank 54. The output 82 of sense amplifier 80 is selected to produce the output signal OUT on line 58.

Thus it can be seen that the MSB 66 can be used to enable or disable the output of the address decoders 60 and 62. But the disabling of one address decoder assures the enabling of the other address decoder as can be seen in FIG. 3. Under normal operating conditions, the selector 56 will select the output of the sense amplifier receiving an input from the memory bank whose address decoder is enabled. When the MSB 66 is being used to disable the address decoder for a given memory bank, we do not want the other memory bank, which is enabled, to produce an output on line 58. Therefore the TEST signal is provided to reverse the meaning of signal MSB as it relates to output selection. When the logic level of signal TEST is false, MSB selects the output of the memory bank whose address decoder is enabled. But when the logic level of signal TEST is HIGH, the meaning of MSB with respect to selection of memory output is inverted by the action of the exclusive-OR gate 76. While the logic level of TEST is HIGH, MSB selects the output of the second memory bank 54 when MSB is 0, and selects the output of the first memory bank 52 when MSB is 1. This result is the reverse of the normal action of MSB with respect to output selection, but is useful during testing as will be seen.

An application of the testing method of the present invention to the apparatus of FIG. 3 includes the following steps: (1) addressing a cell or cell group in one of the memory banks, assuming for this example the first memory bank 52 and applying the LSB's to lines 64; (2) changing address decoder 60 by making the logic level of signal MSB be 1; (3) overriding output selection to select the output of the first memory bank 52 by asserting input signal TEST; (4) making MSB a 0 to enable address decoder 60 and negating signal TEST to maintain selection of the output of the first memory bank 52; (5) measuring the length of the interval between the time of enabling the address decoder 60 and the appearance of an output on line 58; (6) comparing the length of the measured interval with a predetermined fixed limit and if the length is less than or equal to the limit, declaring that the addressed cell or cell group has passed the test, and if the length exceeds the limit, declaring address of the cell or cell group to be a weak cell; (7) repeating the steps from step (1) using a different address until testing of the first memory bank is completed, then reversing the logic level of signal MSB in all steps and repeating the steps from step (1) until testing of the second memory bank is completed.

The additional steps of recording addresses of weak cells and substituting redundant rows or columns as necessary are to be included for memories having such capabilities.

The details of address decoder enabling and output selection and override discussed above with respect to use of the invention with the apparatus of FIG. 3 can be easily modified for alternative addressing and selection configuration. The steps which are present in any application of the invention include: switching address decoding for the memory bank being tested; selecting the output of the memory bank being tested; addressing the cell or cell group to be tested; enabling the address decoding for the memory bank being tested; measuring the delay from address enabling to appearance of an output; comparing the measurement with the limit and taking appropriate follow up action.

We claim:

1. A method of testing non-programmed non-volatile memory arrays, the method comprising the steps of:
    (a) specifying an address of a memory cell to be tested in a memory array at a known first time, said memory cell being in a first logic state,
    (b) specifying an address of an auxiliary memory cell being in a second logic state, said second logic state being distinguishable from the first logic state,
    (c) measuring a delay of an output of the specified memory cell being tested, with reference to said known time, the delay associated with the changing of the output from a level associated with the second logic state to a level associated with the first logic state,
    (d) comparing said measured delay with a specified maximum acceptable delay,
    (e) if said measured delay exceeds said maximum acceptable delay, designating said address of said memory cell as that of a defective memory cell, and
    (f) repeating steps (a) through (e) for other memory cell to be tested in said memory array.

2. The method of claim 1 further comprising the steps of providing a single sense amplifier which first reads said specified memory cell then reads said auxiliary memory cell.

3. The method of claim 1 wherein the step (f) comprises:
    testing every memory cell in said memory array by specifying the address of every memory cell.

4. A method for testing non-programmed, non-volatile memory cells in a non-volatile memory array of the type having rows and columns of non-volatile memory cells, the method comprising the steps of:
    (a) providing a memory array of the type having rows and columns of non-volatile memory cells, and also having an address decoder and at least one array output, every non-programmed, non-volatile memory cell of the memory array being in a first logic state, each memory cell being characterized by a measurable time delay from a first time at which that memory cell is addressed to a second time when an output of the addressed memory cell is produced with a signal level corresponding to said first logic state;
    (b) reserving a memory address corresponding to an addressable memory cell outside of the array, the address referred to as an auxiliary cell, the addressed auxiliary cell producing a second logic state;
    (c) performing the following steps on each memory cell to be tested:
        (i) addressing the auxiliary cell, then
        (ii) addressing a memory cell to be tested, and measuring the time delay which characterizes that memory cell, then
        (iii) comparing the measurement with a predetermined value, and
        (iv) if the measurement exceeds the predetermined value, designating the address of said memory cell as that of a weak cell.

5. The method of claim 4 wherein the memory cells are tested in addressable rows, each memory cell in a row producing a separate output, and each row responding to a different address.

6. The method of claim 4 wherein the memory cells are tested in addressable columns, each column of memory cells producing a single output, and each column responding to a different address.

7. The method of claim 4 further including the steps of recording the address of the weak cell and substituting a redundant group of memory cells for a group of memory cells containing the weak cell.

8. A method for testing non-programmed cells in a non-volatile memory having at least two arrays of the type having rows and columns of memory cells, the method comprising the steps of:
    providing a memory including first and second arrays of the type having rows and columns of memory cells, each array having an address decoder and at least one array output, the memory including selector means for selecting one array output and presenting the selected array output as a memory output, each memory cell of the first array being in a first memory state, each memory cell of the first array being characterized by a measurable time delay from a first time at which that memory cell is addressed to a second time when an output of the addressed memory cell is produced with a signal level corresponding to said first memory state, each memory cell of the second array being in a second memory state;

addressing a cell in the second memory array while selecting the output of a first array; then addressing a memory cell to be tested in the first array while continuing to select the output of the first array; then measuring the time delay which characterizes that memory cell; then comparing the measurement with a predetermined value, and if the measurement is greater than the predetermined value, returning a weak cell result; then repeating these steps for additional memory cells to be tested, continuing from the step of addressing a cell in the second memory array; then when testing of the first array is completed, reversing roles of first and second arrays and commencing testing of the second array.

9. The method of claim 8 wherein the memory cells are tested in addressable rows, each memory cell in a row producing a separate output, and each row responding to a different address.

10. The method of claim 8 wherein the memory cells are tested in addressable columns, each column of memory cells producing a single output, and each column responding to a different address.

11. The method of claim 8 further including the steps of recording the address of the weak cell and substituting a redundant group of memory cells for a group of memory cells containing the weak cell.

12. A method for testing a non-volatile memory, the method comprising the steps of:

providing a memory having at least two banks of memory cells arranged in rows and columns, each bank having address decoders connected to rows and columns of said each bank for addressing at least one of said rows and columns of memory cells in that bank and at least one sense amplifier connected to read memory cells in that bank and to produce an output in response to addressing of a memory cell by said address decoders, all memory cells being in an erased state, each memory cell being characterized by a measurable time delay from a first time at which that memory cell is addressed by said address decoders to a second time when an output of the addressed memory cell is produced by said sense amplifier, the address decoders being disabled so that no row or column is addressed, and the memory having an output selector for selecting the output of each bank's at least one sense amplifier for output as a memory output; and performing the following steps in sequence until testing is completed:

disabling the address decoders and selecting the sense amplifier output of a first memory bank, addressing the at least one memory cell to be tested in the first bank, enabling the address decoders and measuring said time delay which characterizes the at least one addressed memory cell, comparing the measured time delay with a predetermined limit value, if the measured time delay exceeds the predetermined limit value, designate the address of said at least one memory cell as a weak address, then continuing with the next address from the step of disabling the address decoders.

13. The method of claim 12 further including the steps of recording the weak address and substituting a redundant group of memory cells for a group of memory cells corresponding to the weak address.

* * * * *